United States Patent
Dujmenovic

(10) Patent No.: US 6,888,580 B2
(45) Date of Patent: May 3, 2005

(54) INTEGRATED SINGLE AND DUAL TELEVISION TUNER HAVING IMPROVED FINE TUNING

(75) Inventor: Feliks Dujmenovic, Richmond Hill (CA)

(73) Assignee: ATI Technologies Inc., Thornhill (CA)

( * ) Notice: Subject to any disclaimer, the term of this patent is extended or adjusted under 35 U.S.C. 154(b) by 401 days.

(21) Appl. No.: 09/793,552

(22) Filed: Feb. 27, 2001

(65) Prior Publication Data

US 2002/0118308 A1 Aug. 29, 2002

(51) Int. Cl.⁷ ................................................ H04N 5/50
(52) U.S. Cl. ........................ 348/731; 348/725; 348/735
(58) Field of Search ................................ 348/735, 725, 348/726, 727, 728, 729, 731, 732, 733, 536; 455/315, 255, 260, 192.1, 192.3, 187.1, 191.1, 165.1, 173.1, 180.3, 182.3, 183.1, 190.1; 375/376, 375, 371, 373, 326, 327, 344, 345; 327/146–150, 155–159; 331/1 R; H04N 5/50, 5/44

(56) References Cited

U.S. PATENT DOCUMENTS

| | | | | |
|---|---|---|---|---|
| 4,344,045 A | | 8/1982 | Das et al. .................... 331/1 A |
| 4,551,856 A | * | 11/1985 | Victor et al. ............. 455/183.2 |
| 4,965,531 A | | 10/1990 | Riley .......................... 331/1 A |
| 5,038,117 A | * | 8/1991 | Miller .......................... 331/16 |
| 5,285,284 A | * | 2/1994 | Takashima et al. .......... 348/731 |
| 5,737,035 A | | 4/1998 | Rotzoll ........................ 348/725 |
| 5,821,816 A | * | 10/1998 | Patterson .................... 331/1 A |
| 5,847,612 A | | 12/1998 | Birleson ......................... 331/2 |
| 5,929,944 A | * | 7/1999 | Seo ............................. 348/731 |
| 5,999,802 A | * | 12/1999 | Aschwanden ............ 455/196.1 |
| 6,064,272 A | * | 5/2000 | Rhee ............................. 331/16 |
| 6,118,499 A | * | 9/2000 | Fang .......................... 348/726 |
| 6,177,964 B1 | * | 1/2001 | Birleson et al. ............. 348/725 |
| 6,249,685 B1 | * | 6/2001 | Sharaf et al. ................. 455/84 |
| 6,480,703 B1 | * | 11/2002 | Calderone et al. .......... 455/118 |
| 6,567,654 B1 | * | 5/2003 | Coronel Arredondo ..... 455/315 |

FOREIGN PATENT DOCUMENTS

| | | | |
|---|---|---|---|
| EP | 1193877 | * | 4/2003 |
| JP | 409162767 | * | 6/1997 |
| WO | 99/13594 | * | 3/1999 |
| WO | 99/33181 | * | 7/1999 |

OTHER PUBLICATIONS

Best, Roland E., "Phase Locked Loops; Design, Simulation, and Applications 4$^{th}$ Edition", McGraw–Hill, New York, 1999, p 146–147 & 139–140.

Wolaver, Dan H., "Phase–Locked Loop Circtui Design", Prentice Hall, New Jersey, 1991, p 250–252.

* cited by examiner

*Primary Examiner*—Sherrie Hsia

(57) ABSTRACT

Improved television tuning circuits are disclosed. An example tuning circuit includes a fraction-N frequency synthesizer facilitating fine tuning. This tuning circuit may be formed using relatively few independent oscillators. The tuning circuit lends itself to the formation of an tuning circuit on an integrated circuit substrate. As well, this tuning circuit may be used to form a dual tuner tuning circuit integrated on a single integrated circuit substrate.

15 Claims, 8 Drawing Sheets

INTEGRATED SINGLE AND DUAL TELEVISION TUNER HAVING IMPROVED FINE TUNING

FIELD OF THE INVENTION

The present invention relates to television tuners, and more particularly to a tuning circuit including one or more tuners having improved fine tuning, that may be integrated on a single integrated circuit substrate.

BACKGROUND OF THE INVENTION

Television tuning circuits have been known, developed and improved since the advent of the television. Such tuning circuits convert received high frequency radio frequencies to an intermediate frequency ("IF"). Historically, such tuning circuits were embodied in tuners that formed integral parts of single purpose bulky television receivers, typically including a cathode ray tube. These tuners were usually manufactured using conventional discrete passive and active components. Accordingly, tuners had traditionally been quite bulky and expensive to produce.

More recently, television receivers have formed part of smaller electronic devices such as handheld televisions, video cassette recorders ("VCR"s), and personal computing devices. As a result, much has been done to miniaturize television tuning circuits and form such circuits using integrated circuits. For example, U.S. Pat. No. 5,737,035 to Rotzoll discloses a television tuning circuit integrally formed on an integrated circuit substrate.

Existing integrated tuning circuit designs, however, rely on multiple loop frequency synthesizers in order to allow for fine tuning, as for example detailed in U.S. Pat. No. 5,847,612 to Birleson. Multiple loop frequency synthesizers, however, typically only allow for limited fine tuning. Moreover, such multiple loop frequency synthesizers rely on multiple phase locked loops ("PLL"s) and independent voltage controlled oscillators ("VCO"s) co-located on a single integrated circuit substrate.

As such, much care must be taken to prevent the co-located VCOs from interfering with the received signal and with each other. Clearly, the more such VCOs that are used, the more difficult it is to prevent the interference of spurious signals. Current integration techniques, however, typically do not entirely prevent these multiple PLLs and VCOs from interfering with each other.

Accordingly, tuning circuits that reduce the dependence on multiple loop frequency synthesizers and allow improved fine tuning are desirable.

As well, recent television designs have also made concurrent viewing of several channels possible. Such designs typically overlay one picture in another, or present a picture-in-picture ("PIP"). This is made possible through the use of two television tuners providing IF signals representative of each channel to a picture-in-picture mixing circuit. Conventionally, two single tuning circuits are used, one for each IF signal.

The use of two single tuning circuits, of course, requires double the number of components as that required for a single tuning circuit; twice the power consumption; twice the space; and additional assembly time.

Accordingly, integration of multiple tuning circuits would also be desirable.

SUMMARY OF THE INVENTION

In accordance with the present invention, multiple tuning circuits are integrated so that these may be formed largely on a single integrated circuit.

Conveniently, a fractional-N synthesizer is used to fine tune a dual conversion tuner.

Therefore, in accordance with an aspect of the present invention, there is provided a dual television tuner tuning circuit formed on an integrated circuit substrate, including a first dual conversion television tuner operable to tune a first television channel in a received radio frequency signal; a second dual conversion television tuner operable to tune a second television channel independently of the first television channel in the received radio frequency signal; first and second frequency synthesizers associated with the first tuner for tuning the first channel; and third and fourth frequency synthesizers associated with the second tuner for tuning the second channel.

Therefore, in accordance with a further aspect of the present invention, there is provided a dual conversion television tuning circuit for tuning a television channel in a received radio frequency signal, including first and second frequency synthesizers; a first mixer, to mix the channel, with a first mixing signal from the first frequency synthesizer and thereby frequency shift the channel to a first frequency; and a bandpass filter coupling an output of the first mixer to an input of a second mixer. The second mixer mixes the channel with a second mixing signal from the second frequency synthesizer and thereby translates the channel to an intermediate frequency. At least one of the first and second synthesizer is formed using a fractional-N frequency synthesizer, comprising a single controllable oscillator, to allow fine tuning of said tuning circuit.

In accordance with yet another aspect of the present invention, there is provided a method of tuning a television tuner, including synthesizing a mixing signal using a fractional-N frequency synthesizer; providing the mixing signal to a mixer thereby fine tuning the tuner.

In accordance with yet a further aspect of the present invention, a method of tuning a television tuner includes operating a single voltage controlled oscillator to provide a non-integer, fractional multiple of a reference signal; providing the fractional multiple of the reference signal to a mixer and thereby fine tuning the tuner.

Accordingly, in accordance with one more aspect of the present invention, there is provided a method of tuning two co-located television tuners, including synthesizing a first mixing signal using a first fractional-N frequency synthesiser; synthesizing a second mixing signal using a second fractional-N frequency synthesiser; providing the first and second mixing signals to first and second mixers, respectively, thereby fine tuning said two tuners.

Further, in accordance with an additional aspect of the present invention, there is provided a dual television tuner tuning circuit formed on an integrated circuit substrate, including a first dual conversion television tuner operable to tune a first television channel in a received radio frequency signal; means for providing a synthesized signal to the first tuner to tune a first channel to an intermediate frequency; means for providing a synthesized signal to fine tune the first channel to a first output intermediate frequency; a second dual conversion television tuner operable to tune a second television channel in a received radio frequency signal; means for providing a synthesized signal to the second tuner to tune the second channel to an intermediate frequency; and means for providing a synthesized signal to fine tune the second channel to a second output intermediate frequency.

Other aspects and features of the present invention will become apparent to those of ordinary skill in the art, upon review of the following description of specific embodiments of the invention in conjunction with the accompanying figures.

BRIEF DESCRIPTION OF THE DRAWINGS

In the figures.

DETAILED DESCRIPTION

For clarity of description, a conventional television tuning circuit is described with reference to FIGS. 1–3. Thereafter, tuning circuits exemplary of embodiments of the present are described with reference to FIGS. 4–8.

Figure 1:
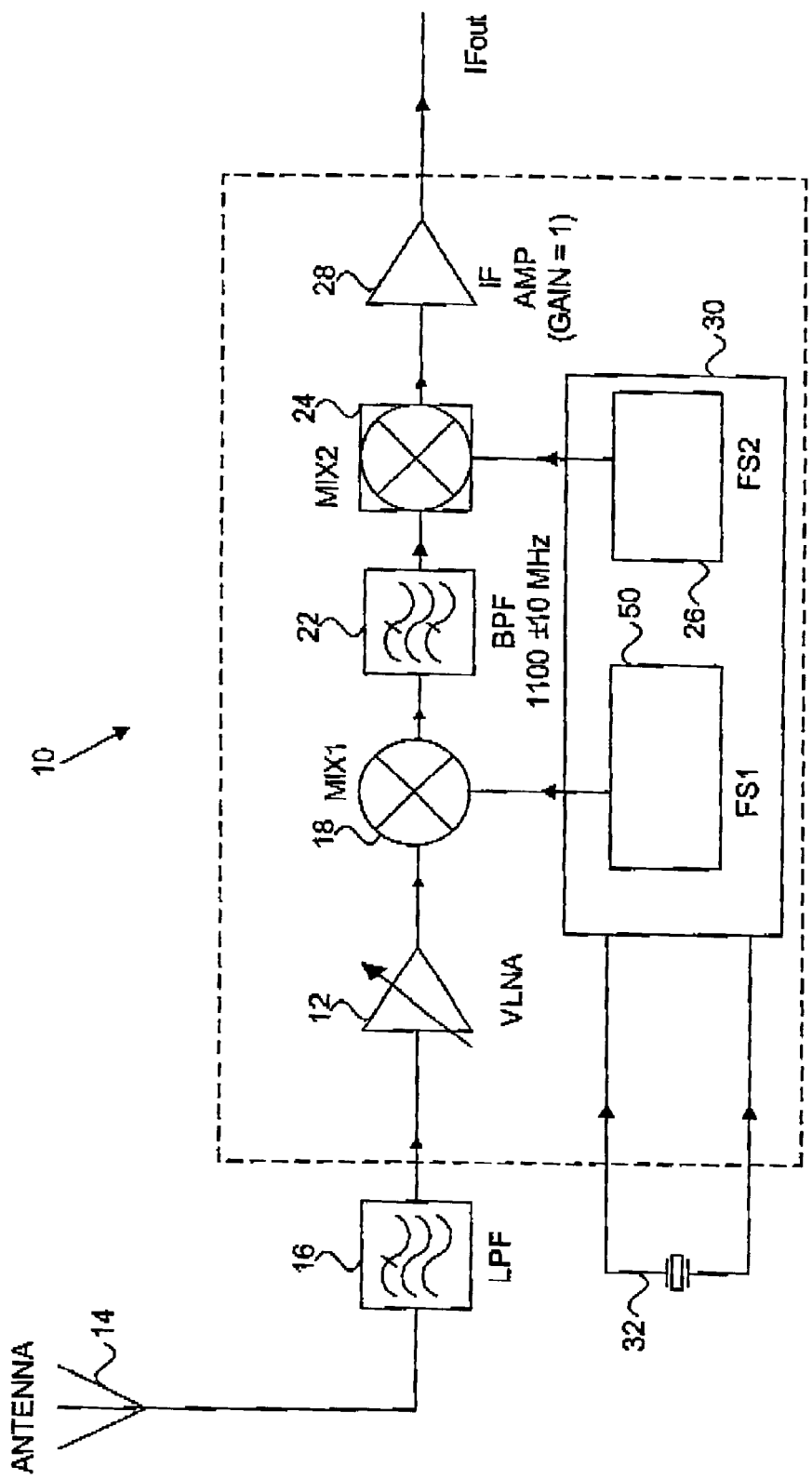
FIG. 1 is a block diagram of a conventional television tuning circuit.

FIG. 1 illustrates a conventional television tuning circuit 10. Television tuning circuit 10 is a conventional dual conversion RF receiver, including a variable gain, low noise amplifier ("VLNA") 12 taking as input an RF signal received from antenna 14, and filtered by lowpass filter 16. Output of VLNA 12 is provided to a mixer 18, where it is mixed with the output of a frequency synthesizer 50 of a frequency synthesizer block 30. This shifts a channel to be tuned to a first intermediate frequency. A bandpass filter 22 having a centre frequency at about this first intermediate frequency receives the output of mixer 18 and filters a lower or higher sideband of the mixed signal. Example bandpass filter 22 may have a fixed bandpass frequency, typically of 1100±10 MHz.

A second mixer 24 mixes the output of the filtered signal from bandpass filter 22 with the output of frequency synthesizer 26 to produce a signal at a final intermediate frequency provided to an IF amplifier 28. IF amplifier 28 preferably has unity gain and thus acts as a buffer. The output of IF amplifier 28 provides the tuned channel at a desired intermediate frequency $IF_{out}$ for further processing.

VLNA 12 may be interconnected with conventional automatic gain control ("AGC") circuitry, not illustrated, but known to those of ordinary skill, so that VLNA 12 may properly amplify the tuned channel.

Mixer 24 is preferably an image rejection mixer, as for example detailed in U.S. Pat. No. 5,737,035. Frequency synthesizer 26 drives mixer 24 to provide a band rejected output signal at a final intermediate frequency ($IF_{out}$) of about 45.75 MHz.

As will be appreciated, North American broadcast television signals are organized in channels located between 50 MHz and 806 MHz of the frequency spectrum. Lowpass filter 16 thus has cut-off frequency of about 900 MHz. Frequency synthesizer 50 is designed to be tunable to oscillate between 1155 MHz and 1915 MHz. As such, a channel to be tuned may be tuned to the first intermediate frequency (i.e. the frequency of the bandpass filter 22), above 900 MHz, by adjusting the operating frequency of frequency synthesizer 50. A crystal oscillator 32, external to tuning circuit 10 provides a reference frequency of around 5 MHz for frequency synthesizer block 30, including frequency synthesizers 50 and 26. Tuning of mixer 18 may be effected in increments of about 5 MHz.

Conveniently, frequency synthesizer 26 is tunable to provide fine tuning of the received channel to a final intermediate frequency, and may thus be tuned to oscillate between 1049.875 MHz and 1055.125 MHz (referred to as "low injection") in increments of 62.5 KHz to provide the tuned channel at $IF_{out}$. As will be appreciated, while not optimal, fine tuning increments of 62.5 KHz have been found to be satisfactory to fine tune a desired channel within the received RF signal.

A person skilled in the art will readily appreciate that other mixing frequencies may be chosen in order to tune a channel of a received RF signal into a suitable IF frequency. Other exemplary possibilities are explained in the U.S. Pat. No. 5,847,612.

Figure 2:
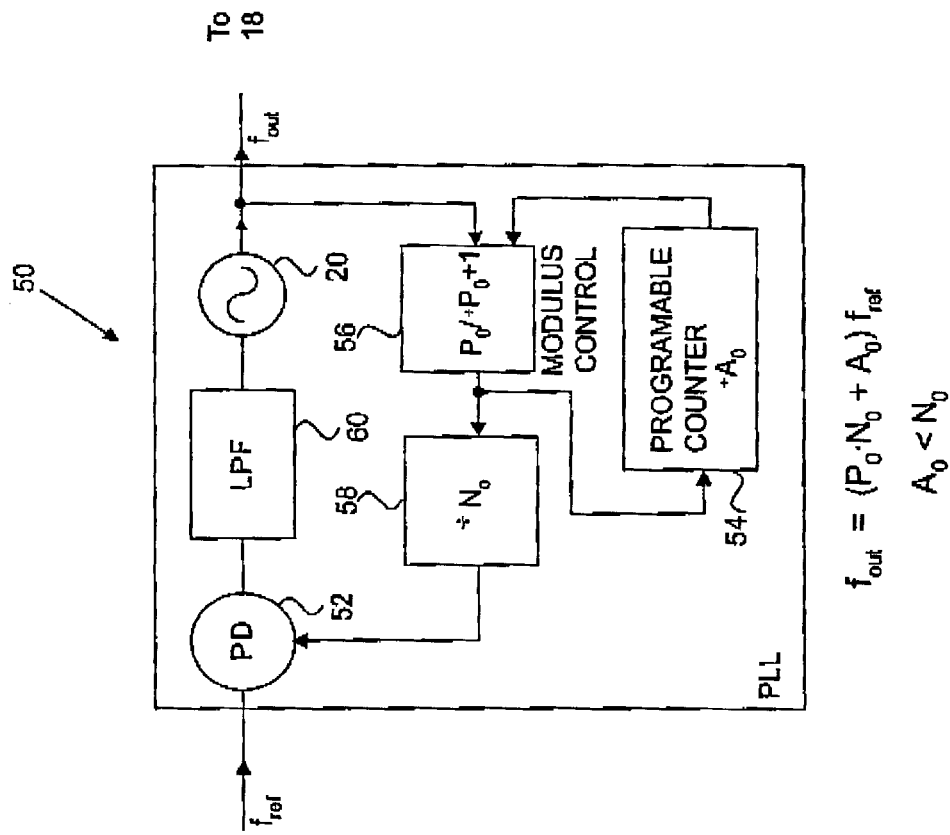
FIG. 2 is a block diagram of a first frequency synthesizer used in the circuit of FIG. 1.

FIG. 2 illustrates a conventional frequency synthesizer 50 that may be used in the tuning circuit of FIG. 1, and that includes an oscillator 20. Oscillator 20 is preferably a VCO. As illustrated, frequency synthesizer 50 is formed as a PLL. Specifically, frequency synthesizer 50 includes phase detector 52 that compares the phase of a reference signal $f_{ref}$ with the output of oscillator 20, frequency divided by $P_0$ or $P_0+1$ by two modulus pre-scaler 56, and by N, by programmable divider 58. Two modulus pre-scaler 56 preferably frequency scales any signal at its input by a factor of $P_0$ or $(P_0+1)$, selectable at pre-scaler 56, depending on its state. Preferably, $P_0$ is fixed and chosen to have a value of six (6). Divider 58 is a programmable, and need only further frequency scales a pre-scaled frequency of one sixth (i.e. $\div P_0$) or one seventh (i.e. $\div(P_0+1)$) of the output of oscillator 20. The state of two modulus pre-scaler 56 is controlled by the output of a programmable counter 54, clocked by the output of two-modulus pre-scaler 58. Programmable counter 54 counts from 1 to $A_0$, and outputs a single overflow pulse every $A_0$ transition of its clock input. The overflow pulse from counter 54 causes pre-scaler 56 to temporarily change its state (i.e. to $\div(P_0+1)$). Pre-scaler 56 remains in this ($\div(P_0+1)$) state for a single clock pulse from counter 54. As a result of pre-scaler 56, programmable divider 56 may thus function at lower frequencies, than if frequency two modulus pre-scaler 56 were omitted. The output of phase detector 52 is suitably filtered by filter 60 and used to drive oscillator 20. As will be appreciated, the frequency of the output of oscillator 20, and hence synthesizer 50 will equal $$f_{out} = f_{ref} * (P_0 * N_0 + A_0) \qquad (1)$$

$f_{ref}$ is provided by external crystal oscillator 32 (FIG. 1) having a fixed operating frequency of 5.25 MHz. For tuning, $N_0$ and $A_0$ are adjusted so that $P_0 * N_0 + A_0$ assumes a value between 209 and 374. A single increment of $N_0$ will effectively increase the output frequency of oscillator 20 by $P_0 * 5.25$ MHz, while an increment of $A_0$ will increase the frequency output of oscillator 20 by 5.25 MHz. $N_0$ and $A_0$ may be provided and varied in any number of ways known to those of ordinary skill in the art. Typically $N_0$ and $A_0$ may be varied by an interconnected microprocessor or controller, through a conventional interface such as an I2C interface (not illustrated). Suitable values of $N_0$ and $A_0$ for tuning defined television channels may be stored in memory associated with the interconnected microprocessor or controller.

Figure 3:
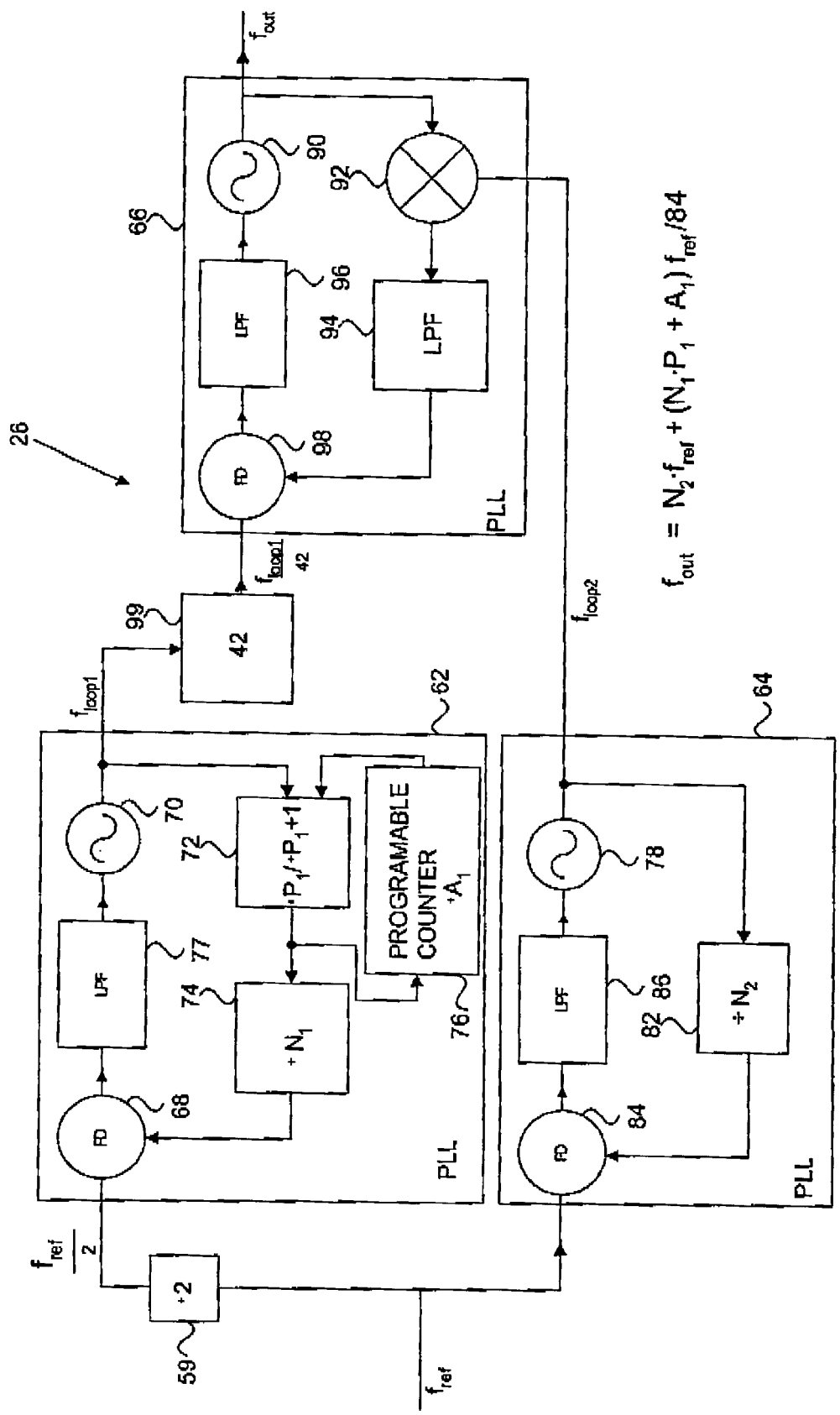
FIG. 3 is a block diagram of a second frequency synthesizer used in the circuit of FIG. 1.

FIG. 3 illustrates a second conventional frequency synthesizer 26 used in the tuning circuit 10 of FIG. 1. Synthesizer 26 is designed to output a frequency of about 1049.875 MHz and 1055.125 MHz, while allowing fine tuning at small fractions of this frequency. Specifically, synthesizer 26 allows fine tuning in steps of 62.5 KHz. In order to accomplish this, synthesizer 26 is formed as a multi-loop synthesizer. Multi-loop syntehsizers are detailed in Dan Wolayer, Phase-Locked Loop Circuit Design (Prentice Hall, New Jersey, 1991), ISBN 0-13-662743-9, the contents of which are hereby incorporated by reference. Synthesizer 26 includes three PLLs 62, 64 and 66, each containing a VCO. Specifically, PLL 62 includes a phase detector 68 that takes as input a reference signal $f_{ref}$ frequency scaled by two (2) by frequency divider 59, and a fed-back, frequency scaled, version of the output of the VCO 70 of PLL 62. The output of VCO 70 is frequency scaled by two modulus pre-scaler 72 and programmable divider 74 by factors $P_1$ or $P_1+1$ and $N_1$, respectively. The state of two modulus pre-scaler 72 is controlled by the output of a programmable counter 76. Programmable counter 76 is clocked by the output of two modulus pre-scaler 72 and counts from 1 to $A_1$, and outputs an overflow clock pulse causing two modulus pre-scaler 72 to temporarily assume its second state (ie. to $\div(P_1+1)$). The phase difference between the output of divider 74 and $f_{ref}$ is filtered by filter 77 and used to drive VCO 70. As will be appreciated the output of PLL 62 will thus have a frequency of $$f_{loop1} = (N_1*P_1+A_1)*f_{ref}/2; \quad (2)$$

controllable by the values of $N_1$ and $A_1$ provided to divider 74 and counter 70.

Frequency divider 99 frequency divides this output by a factor of forty-two (42).

PLL 64, is a conventional frequency scaler, driven by $f_{ref}$. Thus PLL 64, using VCO 78, programmable divider 82, and filter 86, produces an output having a frequency $$f_{loop2} = N_2 * f_{ref} \quad (3)$$

controllable by the values $N_2$ provided to divider 82.

Frequency scaled output of divider 99 is input to phase detector 98 of a third PLL 66. Phase detector 98 is further provided with a signal formed of a frequency scaled version of the output of VCO 90 mixed with the output of PLL 64, mixed by mixer 92. Prior to being provided to detector 98, this signal is filtered by LPF 94.

So, it may be illustrated that $$f_{out} = N_2*f_{ref} + (N_1*P_1+A_1)*f_{ref}/84 \quad (4)$$

Thus, as will now be appreciated, tuning circuit 10 (FIG. 1), as illustrated requires the use of four VCOs (oscillator 20 of frequency synthesizer 50; and VCOs 70, 78, and 90 of frequency synthesizer 26) and allows fine tuning in steps of $1/84*f_{ref}$. Fine tuning may thus be accomplished in steps of 5.25 MHz/84=62.5 KHz. As will be appreciated, fine tuning resolution could be increased by increasing the value of divider 99 to a value greater than 42. However, the larger the divide ratio of divider 99, the narrower the bandwidth of synthesizer 26, and the longer the time required to lock synthesizer 26.

Use of four independent VCOs typically consumes significant power. As such, integrating the four voltage controlled oscillator in combination with VLNA 12, IF amplifier 28, mixer 18, filter 22, and mixer 20 (FIG. 1) on a single integrated circuit substrate in a relatively low power configuration is quite difficult. Moreover, integrating VCOs 54, 66, 78 and 90 so that these are decoupled is further difficult. Specifically, VCOs co-located on the same integrated circuit substrate are subject to substrate coupling, coupling by way of power supply modulation, injection locking, and power supply radiation through external components, as for example described in U.S. Pat. No. 5,737,035. Similarly, outputs of charge pumps used in phase detectors 68, 84 and 98 typically produce interfering voltage spikes at or near the reference frequency. Similarly selecting operating frequencies for the VCOs 70, 78 and 90 to minimize interference with the received RF signal poses challenges.

More significantly, a scaled integrated circuit having two tuning circuits 10 as illustrated would require eight (8) VCOs on a single integrated circuit substrate. Existing technologies make such integration extremely difficult, if not impossible.

Figure 4:
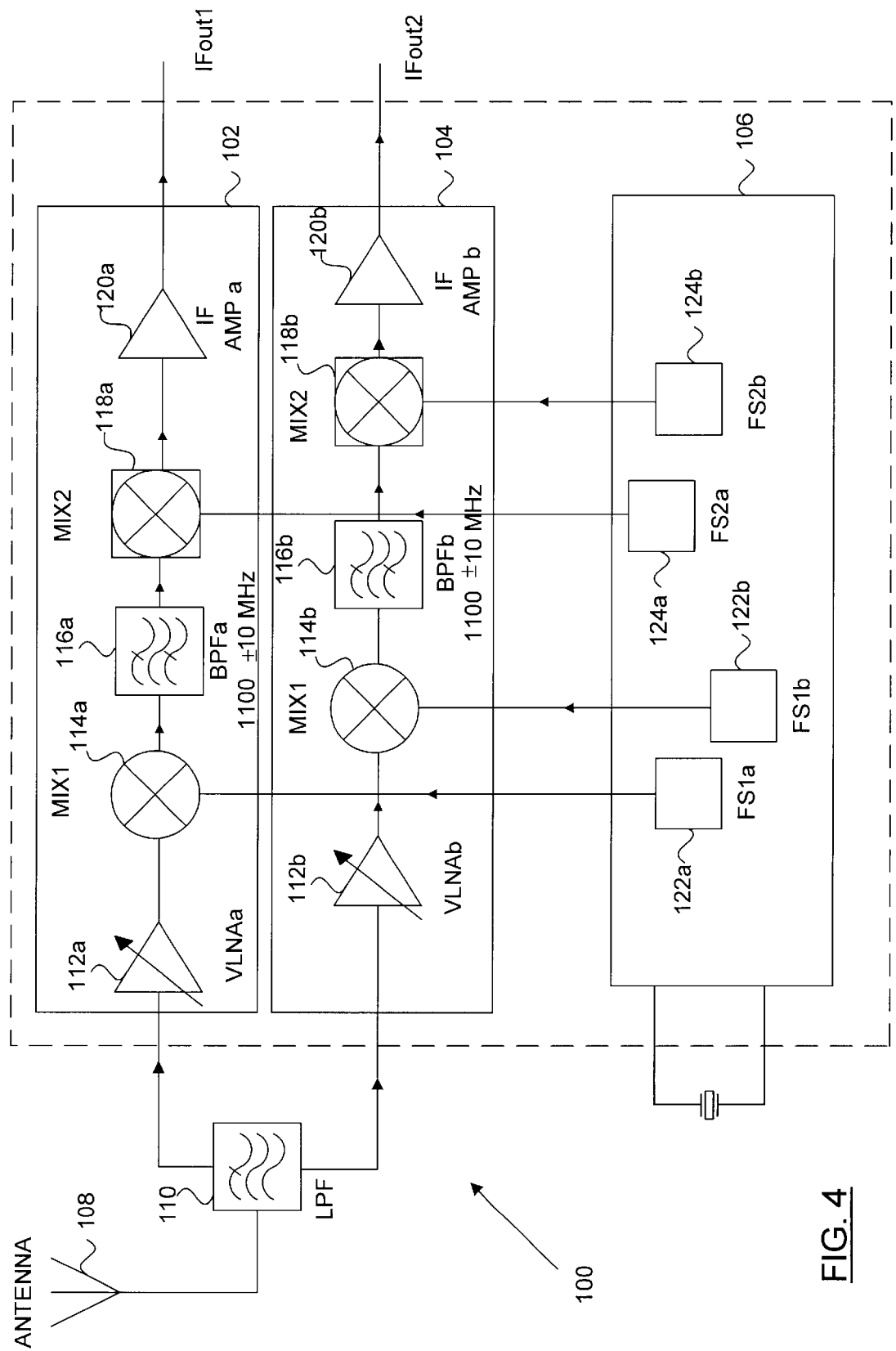
FIG. 4 is a block diagram of an integrated dual tuner television tuning circuit, exemplary of an embodiment of the present invention.

Accordingly, FIG. 4 illustrates a dual tuner tuning circuit 100, exemplary of an embodiment of the present invention.

Tuning circuit 100 includes first and second dual conversion tuners, tuner 102 and tuner 104. First tuner 102 is formed by first VLNA 112a, taking as its input an RF signal from external antenna 108 band limited by lowpass filter 110, and having an output provided to first high frequency mixer 114a. Mixer 114a mixes the RF signal with the output of a frequency synthesizer 122a of synthesizer block 106 and provides an output to first bandpass filter 116a. Output of bandpass filter 116a is provided to mixer 118a. Mixer 118a mixes the bandpass filtered signal and output of second frequency synthesizer 124a of synthesizer block 106, and thereby shifts a first tuned channel to a final intermediate frequency. A low noise, unity gain IF amplifier 120a receives the output of mixer 118a and outputs a tuned television or radio channel at $IF_{out1}$. Again, a conventional AGC circuit (not illustrated) may be used to control the gain of VLNA 112a.

Second tuner 104 is similarly formed and independently tunes a desired channel to $IF_{oout2}$. Second tuner 104 is formed by first VLNA 112b, taking as its input an RF signal from external antenna 108 band limited by lowpass filter 110, and having an output provided to its first high frequency mixer 114b. Mixer 114b mixes the RF signal with the output of frequency synthesizer 122b of synthesizer block 106 and provides an output to its first bandpass filter 116b. Output of bandpass filter 116b is provided to mixer 118b. Mixer 118b mixes the bandpass filtered signal and output of second frequency synthesizer 124b of synthesizer block 106, and thereby frequency shifts a second tuned channel to a final intermediate frequency. A low noise, unity gain, IF amplifier 120b receives the output of mixer 118b and outputs a tuned television or radio channel at $IF_{out2}$.

VLNAs 112a, 112b, mixers 114a, 114b, 118a, 118b, filters 110, 116a, 116b and IF amplifiers 120a and 120b may be formed in the same way, and with the same operating parameters, as VLNA 12, mixers 18, 24, filters 16, 22 and IF amp 28, respectively, of tuning circuit 10 (FIG. 1).

Frequency synthesizers 122a and 122b may be formed using a standard phase locked loop arrangement, identical to frequency synthesizer 50 of tuning circuit 10, as illustrated in FIG. 2. Independent variation of operating parameters $N_0$ and $A_0$ for each of frequency synthesizers 122a and 122b allows a channel to be received by tuner 102 to tuned to the bandpass frequency of bandpass filter 116a and a channel to be received by tuner 104 to be tuned to the bandpass frequency of filter 116b. Again, the tuned channel may then be fine tuned form the first intermediate frequency to a final intermediate frequency by mixer 118a and mixer 118b.

Figure 5:
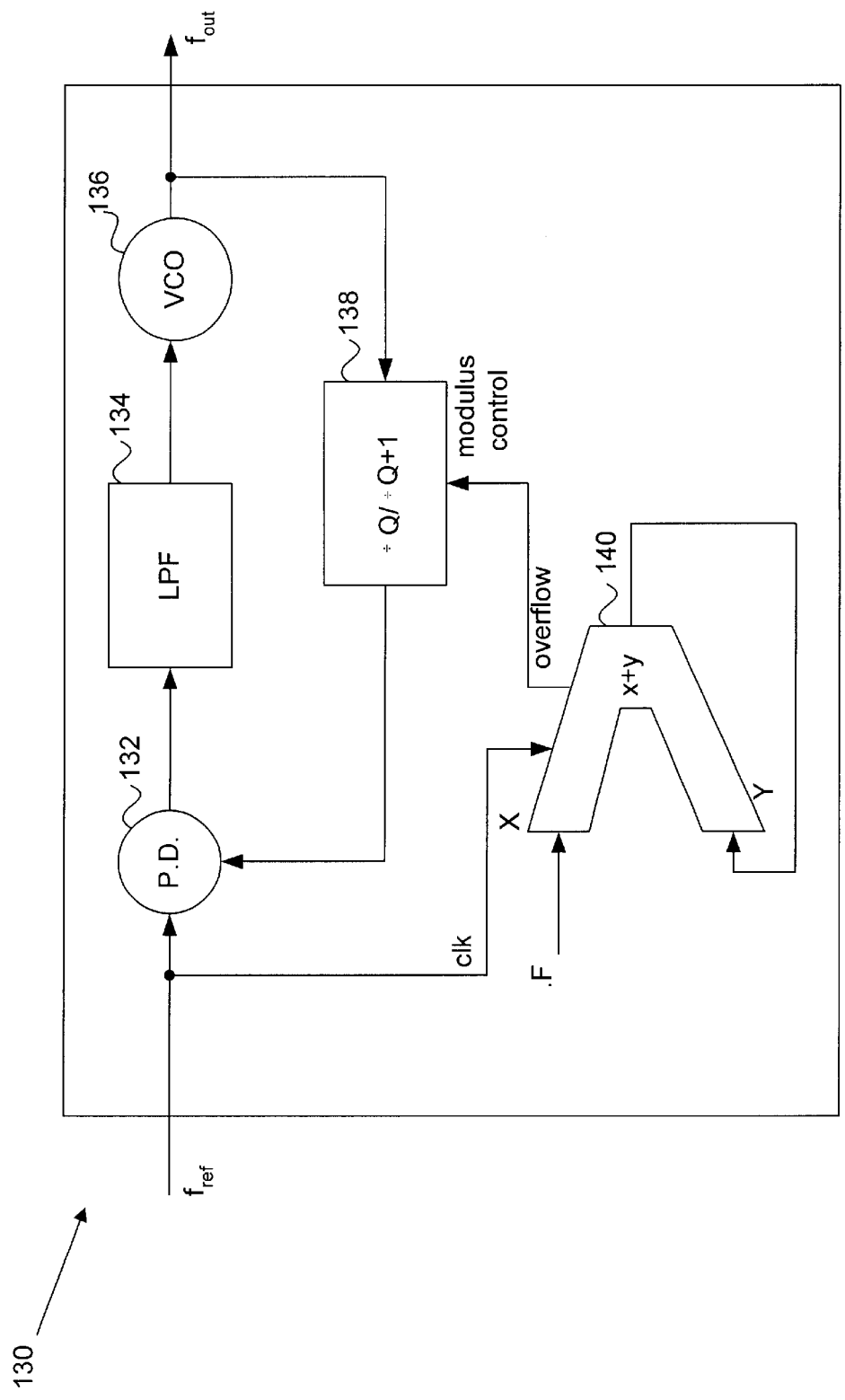
FIG. 5 is a block diagram of a fractional-N synthesizer used to form frequency synthesizers in the circuit of FIG. 4.

Frequency synthesizers 124a and 124b used to mix the outputs of bandpass filters 118a and 118b are, however, preferably each formed as a fractional-N synthesizer 130 as illustrated in FIG. 5.

In order to appreciate the formation and operation of fractional-N synthesizer 130, it is worth noting that for a conventional frequency synthesizer formed using a single PLL (such as frequency synthesizers 50, 122a, 122b in FIGS. 1, 2 and 4), $f_{out}=M \times f_{ref}$, where M is the divide ratio of the feedback loop of the PLL. The divide ratio M is an integer, and therefore the frequency resolution of the locked loop is $f_{ref}$. As such a fine frequency resolution, as is desired for fine tuning requires a small $f_{ref}$. A small $f_{ref}$ translates into a correspondingly narrow loop bandwidth of an associated PLL. Loops with narrow bandwidths are undesirable because of long switching times, inadequate suppression of VCO phase noise, and susceptibility to hum and noise.

Advantageously, a fractional-N synthesizer 130, as illustrated in FIG. 5 allows a PLL to have frequency resolution finer than $f_{ref}$. As illustrated, a reference signal is provided to a phase detector 132, having an output in communication with a VCO 136, by way of a suitable filter 134. The output of VCO 136 is fed back to phase detector 132, after frequency division by programmable two-modulus scaler 138. Two-modulus scaler 138 frequency divides the output of VCO 136 by Q or Q+1, depending on its state. Conveniently, the value of Q may be programmed. The state of two modulus scaler 138 is controlled by the output of an accumulator 140. Accumulator 140 is clocked by the reference signal $f_{ref}$ input to phase detector 132. Accumulator 140 sums inputs X and Y at its output on the transition of the provided clock. An overflow line outputs a signal (i.e. carry bit) each time the accumulators output exceeds one for a single period of the clock signal provided to the accumulator. As illustrated a fractional value .F is input at input X. .F is preferably fixed. The summed output is fed back to the Y input. The integer divide ratio of modulus pre-scalar is periodically altered from Q to (Q+1) for one cycle of $f_{ref}$ as a result of the presence of an overflow. As a result, the average divide ratio for loop 130 will be increased from Q by the duty cycle of the Q+1 division.

That is,

M*reference period=number of pulses with normal pulse width*normal pulse width+number of pulses with altered pulse width*altered pulse width, or $M/f_{ref}=(M-k) \times Q/f_{out}+k(Q+1)/f_{out}$; $\Rightarrow f_{out}=(MQ+k)/(M/f_{ref})=(Q+k/M) \times f_{ref}$; $k,M-integers \Rightarrow k<M, \Rightarrow f=(Q+.F) \times f_{ref}.F=k/M$ (.F is fraction)   (5)

As should now be apparent, fractional frequency synthesizer 130 requires single controllable oscillator such as VCO 136. As such, the dual tuner circuit 100 of FIG. 4 may be formed with only four VCOs (i.e. one for each of frequency synthesizers 122a, 122b, 124a and 124b). Additionally, each frequency synthesizer 124a, 124b (using a fractional-N synthesizer 130) may be formed having an arbitrarily fine resolution, without narrowing the bandwidth of the phase locked loop used to form the oscillator. This, in turn facilitates improved fine tuning for tuners 102 and 104.

As should also be apparent, various single oscillator fractional-N synthesizers may be employed in place of exemplary fractional-N synthesizer 130. Examples of such fractional-N synthesizers are described in U.S. Pat. No. 4,965,531 to Riley, and Roland E. Best, Phase Locked Loop 3rd Edition, (McGraw-Hill, New York, 1997), ISBN 0-07-1349030, the contents of both of which are hereby incorporated by reference, and in Wolayer (supra.).

Figure 6:
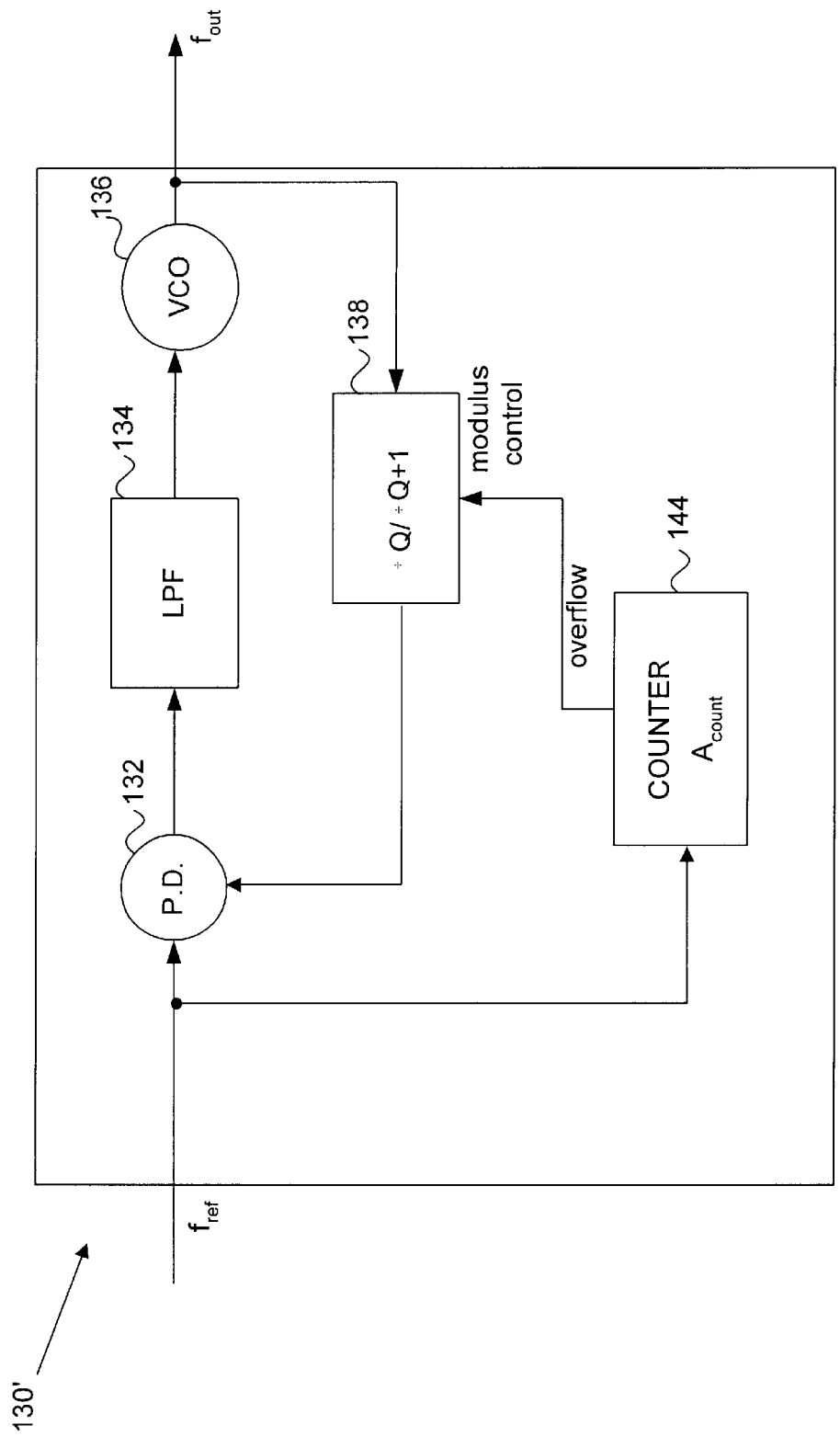
FIG. 6 is a block diagram of an alternative fractional-N synthesizer that may be used in place of the fractional-N synthesizer of FIG. 5.

FIG. 6 illustrates a further example fractional-N synthesizer 130', formed in substantially the same manner as fractional-N synthesizer 130 of FIG. 5, but using a simple counter 144 clocked by $f_{ref}$, in place of accumulator 140 of fraction N synthesizer 130. Counter 144 is clocked by $f_{ref}$ and provides an overflow bit once it counts to a value of $A_{count}$. This, in turn, is used to toggle the state of two-modulus scaler between ÷Q and ÷(Q+1) for one period of the reference signal $f_{ref}$. As will be appreciated $A_{count}$ (like .F provided to accumulator 140) need not be programmable.

Again using the analysis above, it may be illustrated that the average output frequency of fractional-N synthesizer $$f_{out}=(Q+k/M) \times f_{ref} \quad (6)$$

with $M/k=A_{count}$.

As the counter 144 is reset to one after each overflow, use of synthesizer 130' only allows integer fractions of $f_{ref}$ to be generated (ie. $f_{out}=(P_0+1/A_{count})f_{ref}$, with $A_{count}$ equaling an integer. Other arrangements allowing a synthesizer using counters in place of an accumulator, and otherwise similar to fractional-N synthesizer 130' that may generate arbitrary rational fractions of $f_{ref}$ will be readily appreciated.

With the reduced number of VCOs, dual tuning circuit 100 may conveniently be integrated on a single integrated circuit substrate. Individual components may be integrated using conventional techniques. Such an integrated dual tuning circuit may be formed using traditional CMOS or bi-polar CMOS integration techniques. Other integration techniques known to those of ordinary skill could likely also be employed.

An integrated dual tuning circuit may further include inputs to control $N_0$ and $A_0$ for frequency synthesizer 122a, and Q for frequency synthesizer 124a associated with tuner 102 and $N_0$ and $A_0$ for frequency synthesizer 122b and Q for frequency synthesizer 124b associated with tuner 104. As such, an integrated dual tuning circuit may include a suitable interface, such as an I2C interface or the like.

In operation, suitable inputs controlling the values of $N_0$, $A_0$ for frequency synthesizers 122a and 122b are provided to tuning circuit 100, by way of a suitable interface (not illustrated). Again, suitable $N_0$ and $A_0$ values for channels to be tuned may be stored in a memory associated with a processor or controller providing these values. The provided values cause mixer 114a to tune a first desired channel to the frequency of bandpass filter 116a, and mixer 114b to tune a second desired channel to the frequency of bandpass filter 116b. Suitable values of Q are provided to frequency synthesizers 124a and 124b to fine tune the desired channels and provide the signals at $IF_{out1}$ and $IF_{out2}$. As will be appreciated, as only four voltage controlled oscillators are used, injection locking and cross coupling and the like are minimized.

Figure 7:
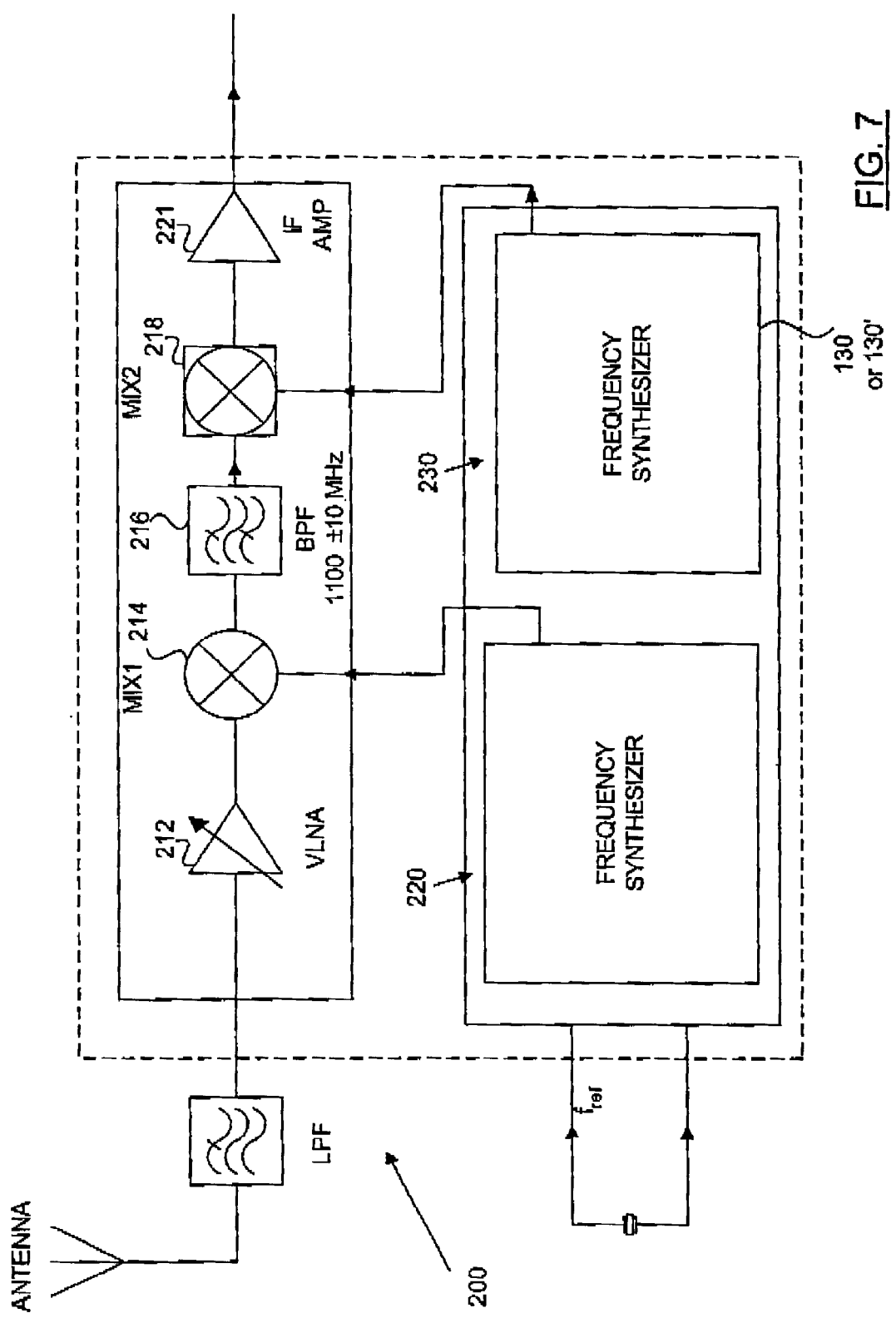
FIG. 7 is a block diagram of an integrated television tuning circuit, exemplary of a further embodiment of the present invention.

Of course, a tuning circuit 200, exemplary of a further embodiment of the present invention, as illustrated in FIG. 7, may be formed having a single double conversion tuner including a VLNA 212, mixer 214, bandpass filter 216, mixer 218, and IF amplifier 220. VLNA 212, mixer 214, filter 216, mixer 218, and IF amplifier 221 may be formed the same way as VLNA 112a, mixer 114a, bandpass filter 116a, mixer 118a, amplifier 120a. Mixer 214 mixes output of a conventional frequency synthesizer 220, identical to frequency synthesizer 122a to tune a desired channel, and mixer 218 mixes output of a fractional-N frequency synthesizer 230, like fractional-N frequency synthesizer 130 (FIG. 5) or 130' (FIG. 6), to fine tune the channel. Tuning circuit 200 may also be integrated on a single monolithic integrated circuit using traditional CMOS or bi-polar CMOS integration techniques.

Alternatively, more than two tuning circuits could possibly be integrated, using the present invention.

Figure 8:
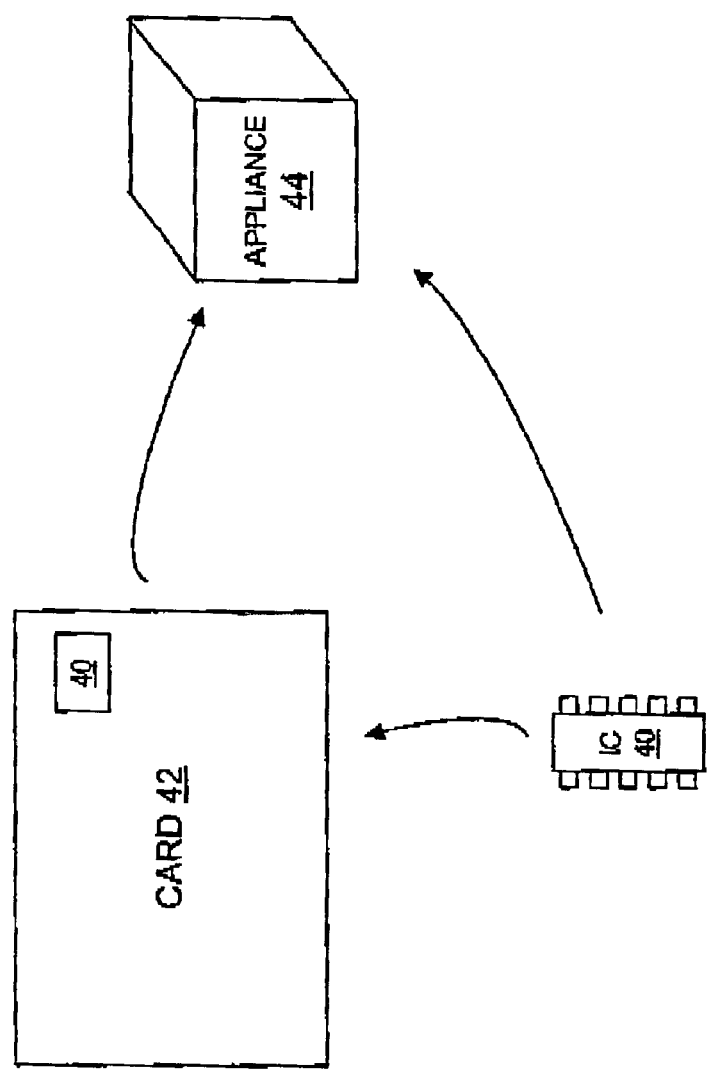
FIG. 8 illustrates exemplary devices and components embodying the tuning circuits of FIGS. 4 and 7.

As illustrated in FIG. 8, tuning circuit 100 or tuning circuit 200 embodied in an integrated circuit casing 40 that may be used in tuning module 42. Tuning module 42 may be computer card, a circuit board for use in a television, video appliance, electronic appliance 44, or the like. Electronic appliance 44 could be a conventional television, optionally providing picture-in-picture; a VCR; a set-top box, such as a cable TV receiver or an integrated television receiver and computing device; or any other TV appliance. Conveniently, such a video appliance may include a processor or controller used to provide suitable operating parameters to tuning circuit 100 or tuning circuit 200.

As will now be appreciated, use of tuning circuit 100 allows concurrent tuning of two television signals by tuners 102 and 104. The tuned television signals may be provided to a suitable picture-in-picture processor and video decoder for presenting a picture-in-picture image on a television appliance.

Alternatively, one tuner (102 or 104) of tuning circuit 100 may be used to tune frequency modulated ("FM") radio signals, while the other tuner (104 or 102) may be used to tune a television signal.

The above described embodiments are intended to be illustrative only and in no way limiting. The described embodiments are susceptible to many modifications of form, arrangement of parts, and details and order of operation. The invention, rather, is intended to encompass all such modification within its scope, as defined by the claims.

What is claimed is:

1. A dual television tuner tuning circuit formed on an integrated circuit substrate, comprising:
    a first dual conversion television tuner operable to tune a first television channel in a received radio frequency signal;
    a second dual conversion television tuner operable to tune a second television channel independently of said first television channel in said received radio frequency signal;
    first and second frequency synthesizers associated with said first tuner for tuning said first channel;
    third and fourth frequency synthesizers associated with said second tuner for tuning said second channel;
    wherein one of said first and second synthesizers comprises a fractional-N synthesizer, comprising a single controllable oscillator to fine tune said first dual conversion tuner, and one of said third and fourth frequency synthesizers comprises a fractional-N synthesizer comprising a single controllable oscillator to fine tune said second dual conversion tuner.

2. The circuit of claim 1, wherein for each of said fractional-N synthesizers:
    said controllable oscillator comprises a voltage controlled oscillator providing an output;
    and wherein each of said fraction-N synthesizer comprises: a dual modulus scaler having two states and operable to frequency scale said output of by a first value in its first state, and by a second value in its second state to provide a frequency scaled output;
    a phase detector to detect a phase difference between a periodic reference signal and said frequency scaled output, and having an output controlling said voltage controlled oscillator; and
    an accumulator in communication with said modulus scaler, for changing the state of said modulus scaler after a plurality of periods of said reference signal.

3. The tuning circuit of claim 2, wherein each of said first and second tuners comprises:
    a first mixer, to mix said channel, with a first mixing signal from one of said first and third frequency synthesizer and thereby frequency shift a tuned channel to a first intermediate frequency;
    a bandpass filter coupling an output of said first mixer to an input of a second mixer;
    said second mixer to mix said channel with a second mixing signal from one of said second and fourth frequency synthesizer and thereby translate said channel to a final intermediate frequency.

4. The circuit of claim 1, wherein for each of said fractional-N synthesizers comprises:
    said controllable oscillator comprises a voltage controlled oscillator providing an output;
    and wherein each of said fraction-N synthesizer comprises: a two modulus scaler having two states and operable to frequency scale said output of by a first value in its first state, and by a second value in its second state to provide a frequency scaled output;
    a phase detector to detect a phase difference between a periodic reference signal and said frequency scaled output, and having an output controlling said voltage controlled oscillator, and
    a counter in communication with said modulus scaler, for changing the state of said two modulus scaler after a plurality of periods of said reference signal.

5. The tuning circuit of claim 1, formed as a CMOS integrated circuit.

6. The tuning circuit of claim 1, formed as a bi-polar CMOS integrated circuit.

7. A television receiver comprising the tuning circuit of claim 1.

8. A VCR comprising the tuning circuit of claim 1.

9. A computing device comprising the tuning circuit of claim 1.

10. A tuning module for use in an electronic appliance, said tuning module comprising the tuning circuit of claim 1.

11. A dual conversion television tuning circuit for tuning a television channel in a received radio frequency signal, comprising:
    first and second frequency synthesizers;
    a first mixer, to mix said channel, with a first mixing signal from said first frequency synthesizer and thereby frequency shift said channel to a first frequency;
    a bandpass filter coupling an output of said first mixer to an input of a second mixer;
    said second mixer to mix said channel with a second mixing signal from said second frequency synthesizer and thereby translate said channel to an intermediate frequency;
    wherein at least one of said first and second synthesizer is formed using a fractional-N frequency synthesizer, comprising a single controllable oscillator, to allow fine tuning of said tuning circuit.

12. The tuning circuit of claim 11, wherein said second mixer comprises an image rejection mixer.

13. The tuning circuit of claim 11, wherein said fractional-N synthesizer comprises:
    a two modulus scaler having two states and operable to frequency divide said output by a first value in its first state, and by a second value in its second state to provide a frequency scaled output;
    a phase detector to detect a phase difference between a periodic reference signal and said frequency scaled output, and having an output controlling said controllable oscillator;

an accumulator in communication with said two modulus scaler, for changing the state of said two modulus scaler after a plurality of periods of said reference signal.

14. A method of tuning two co-located television tuners, comprising:

synthesizing a first mixing signal using a first fractional-N frequency synthesiser having a single controllable oscillator to provide a first fine tuning signal therefrom;

synthesizing a second mixing signal using a second fractional-N frequency synthesiser having a single controllable oscillator to provide a second fine tuning signal therefrom;

providing said first and second mixing signals to first and second mixers, respectively, thereby fine tuning said two tuners.

15. A dual television tuner tuning circuit formed on an integrated circuit substrate, comprising:

a first dual conversion television tuner operable to tune a first television channel in a received radio frequency signal;

means for providing a synthesized signal to said first tuner to tune a first channel to an intermediate frequency;

means for providing a synthesized signal from a single controllable oscillator to fine tune said first channel to a first output intermediate frequency;

a second dual conversion television tuner operable to tune a second television channel in a received radio frequency signal;

means for providing a synthesized signal to said second tuner to tune said second channel to an intermediate frequency;

means for providing a synthesized signal from a single controllable oscillator to fine tune said second channel to a second output intermediate frequency.

* * * * *